United States Patent [19]

Rouberoi et al.

[11] Patent Number: 4,779,046

[45] Date of Patent: Oct. 18, 1988

[54] ELECTRON BEAM INTEGRATED CIRCUIT TESTER

[75] Inventors: Jean-Michel Rouberoi, St. Germain En Laye; François Costa de Beauregard, Paris, both of France

[73] Assignee: Cameca, Courbevoie, France

[21] Appl. No.: 880,553

[22] Filed: Jun. 30, 1986

[30] Foreign Application Priority Data

Jun. 28, 1985 [FR] France .................. 85 09893

[51] Int. Cl.$^4$ .................. H01J 37/147; H01J 37/153; H01J 37/26; G01R 31/26

[52] U.S. Cl. .................. 324/158 R; 250/298; 250/299; 250/310; 250/397

[58] Field of Search .................. 324/158 R; 250/310, 250/311, 396 R, 396 ML, 305, 492.2; 230/397, 298, 299

[56] References Cited

U.S. PATENT DOCUMENTS

| 4,426,577 | 1/1984 | Koike et al. ............ 250/310 |
| 4,514,638 | 4/1985 | Lischke et al. ............ 250/398 X |

FOREIGN PATENT DOCUMENTS

| 138610 | 4/1985 | European Pat. Off. .... 250/396 ML |
| 2116289 | 11/1971 | Fed. Rep. of Germany . |
| 2184713 | 12/1973 | France . |
| 41654 | 3/1980 | Japan .................. 250/396 ML |
| 192255 | 11/1983 | Japan .................. 250/311 |
| 100349 | 6/1985 | Japan .................. 250/310 |
| 1128107 | 6/1968 | United Kingdom . |
| 1364930 | 8/1974 | United Kingdom .............. 250/311 |

*Primary Examiner*—Reinhard J. Eisenzopf
*Assistant Examiner*—Stephen M. Baker
*Attorney, Agent, or Firm*—Cushman, Darby & Cushman

[57] ABSTRACT

An electric beam integrated circuit tester including a source of primary electrons, a support for the integrated circuit, and an electronic column fixed above the support for the integrated circuit for focusing the primary electron beam emitted at the surface of the circuit on the points of the circuit to be tested. It also includes an accelerator of the secondary electrons emitted by the integrated circuit in a direction colinear and opposite that of the primary electron beam, a separator with three pole pieces for directing out of the column the beam of secondary electrons accelerated by the accelerator and an energy spectrometer coupled to the separator and fixed to the outside of the column for analyzing, depending on their energy, the electrons of the beam of secondary electrons emitted separately by the separator.

6 Claims, 7 Drawing Sheets

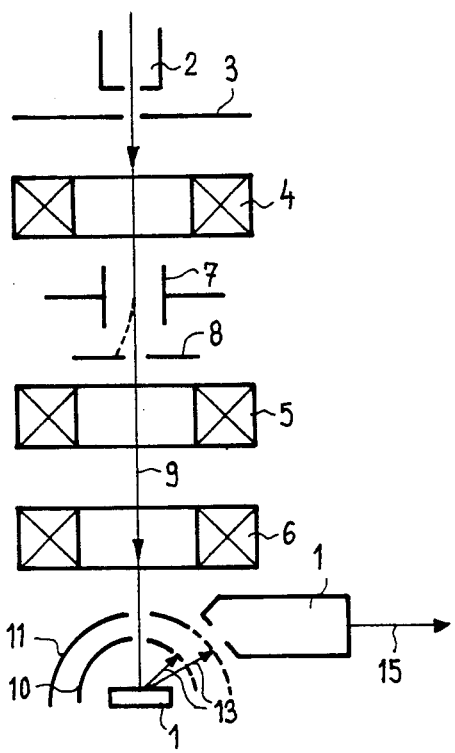
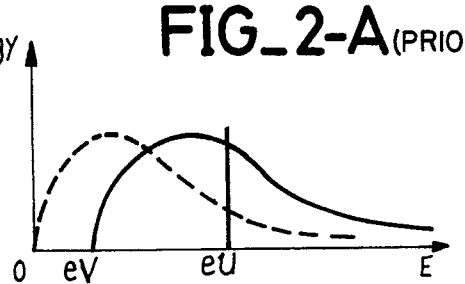
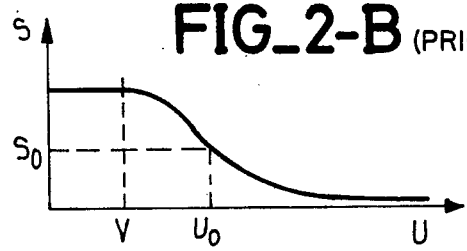
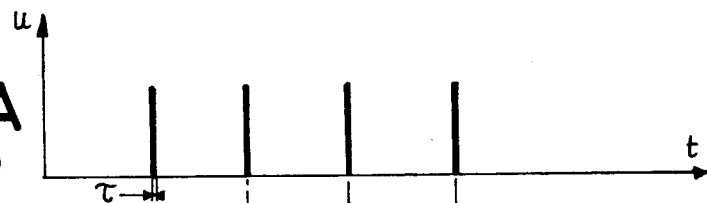
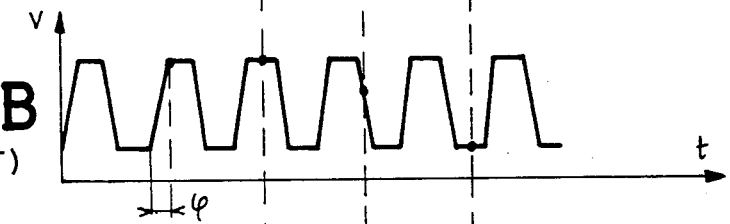
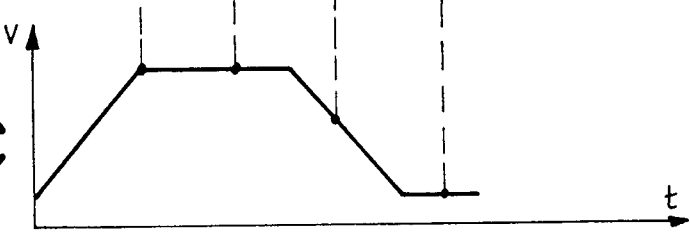

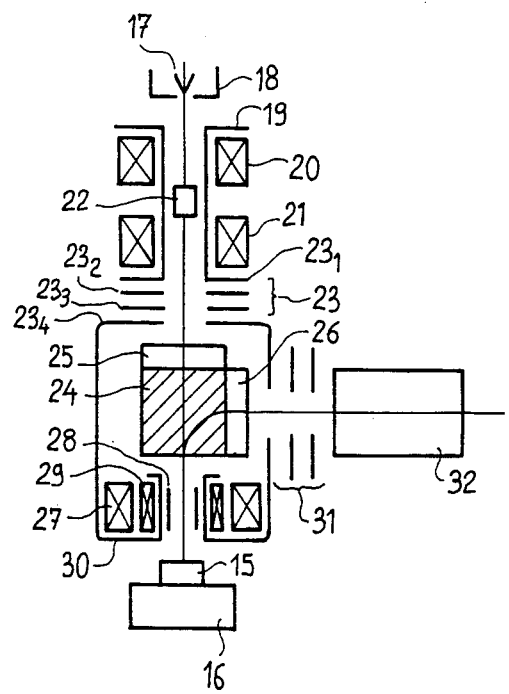
FIG_4
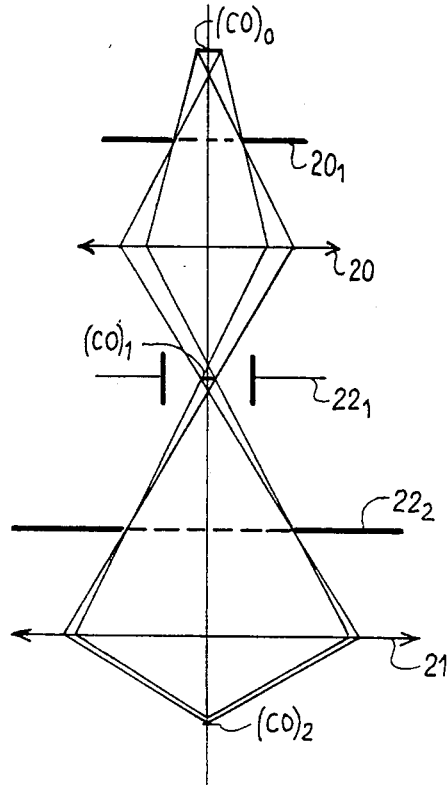
FIG_5

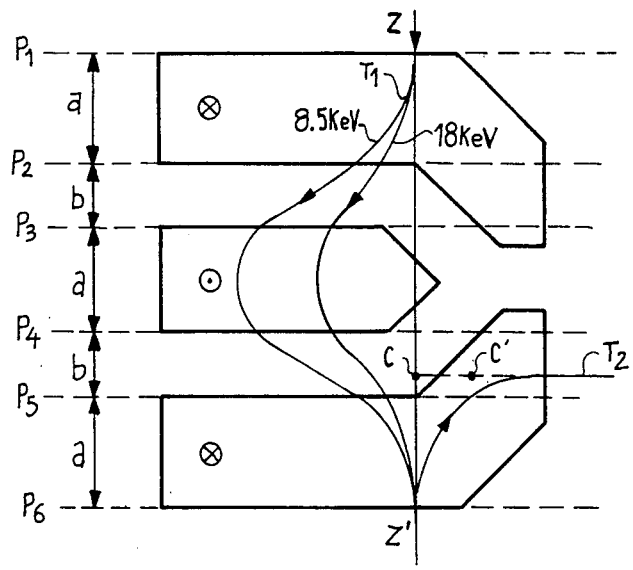
FIG_6
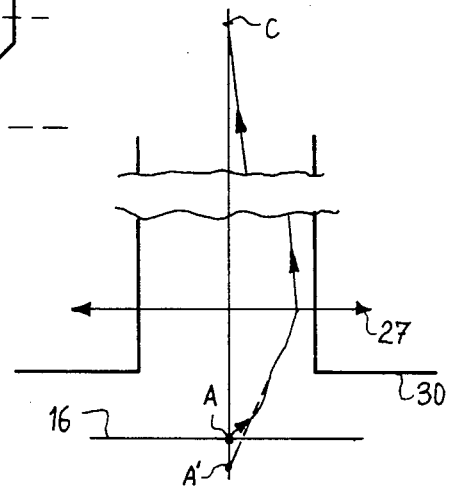
FIG_7
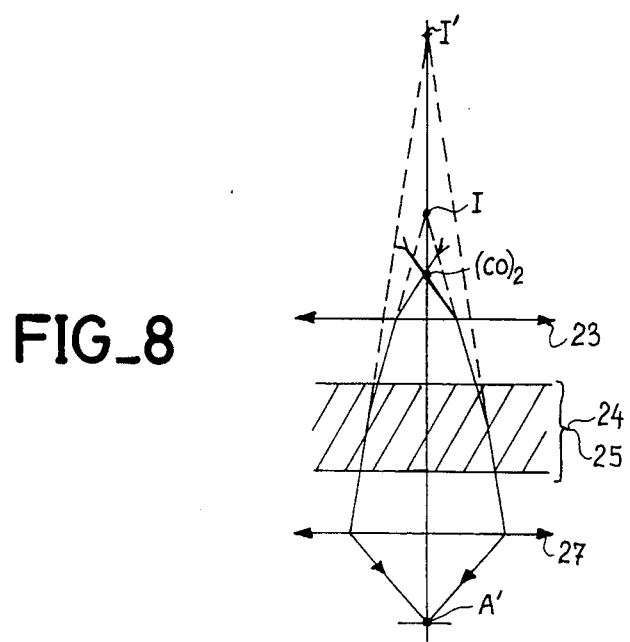
FIG_8

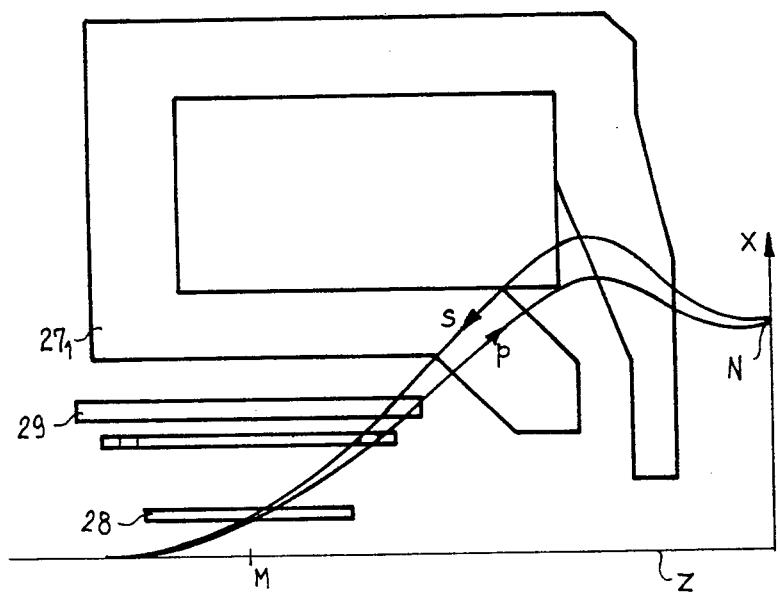
FIG_9-A
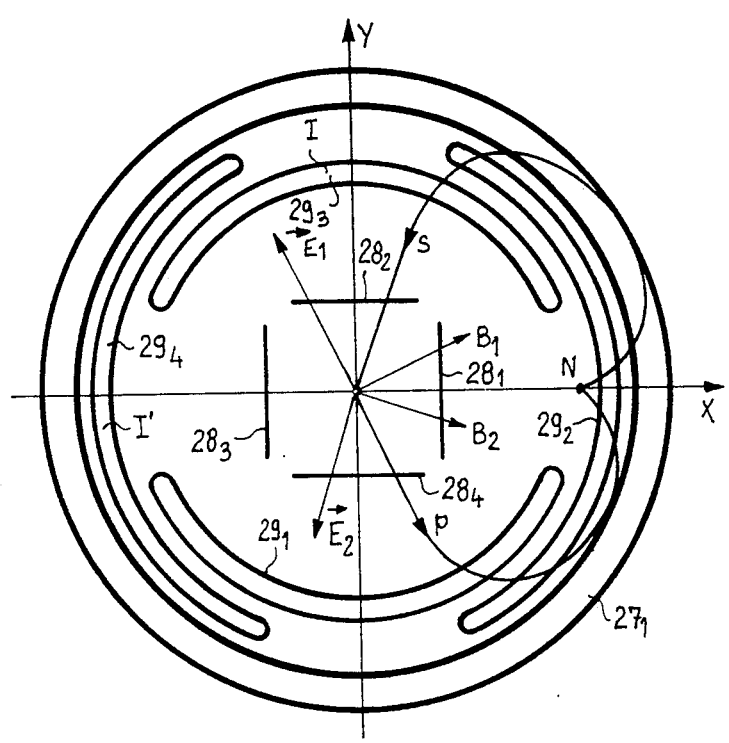
FIG_9-B

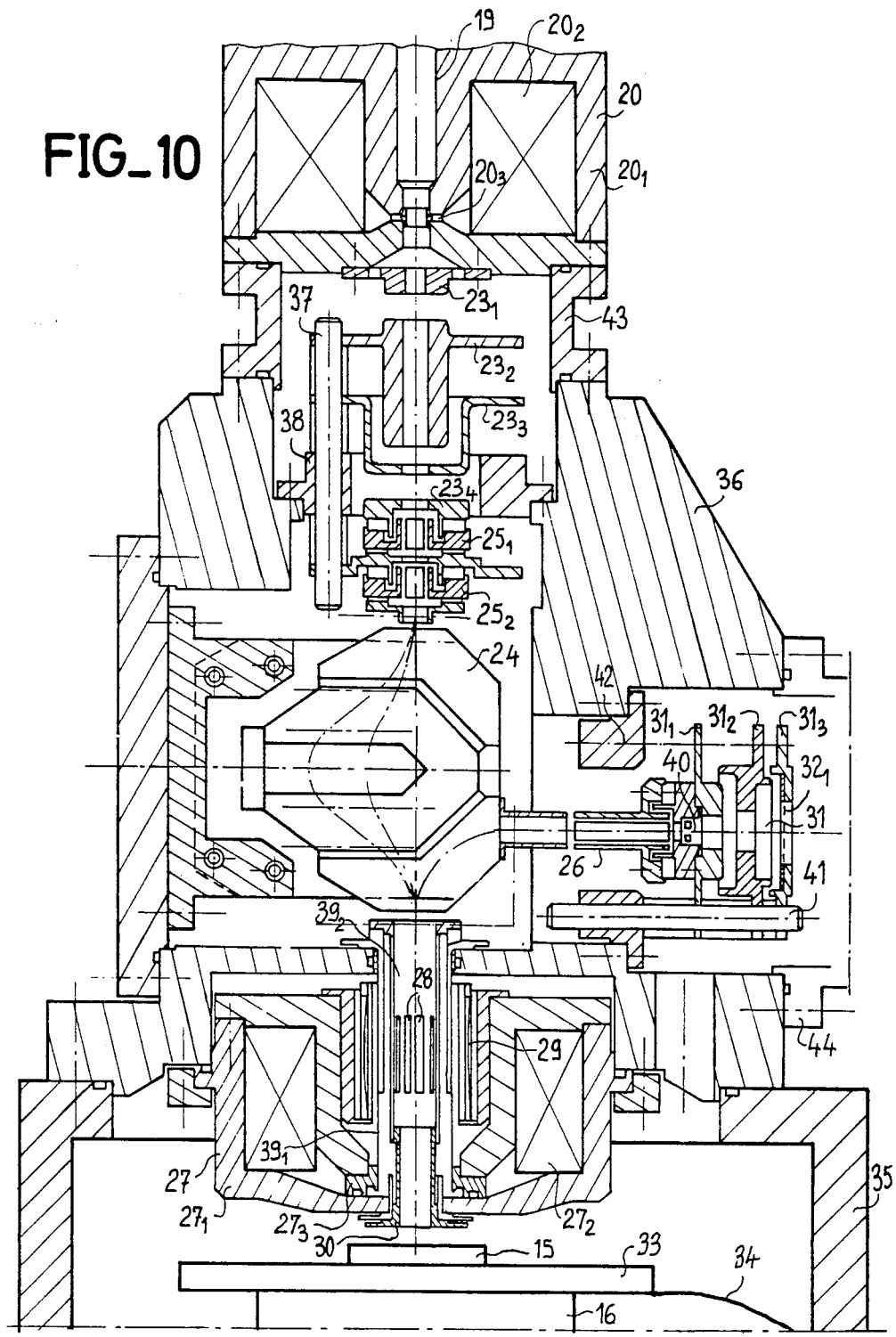
FIG_10

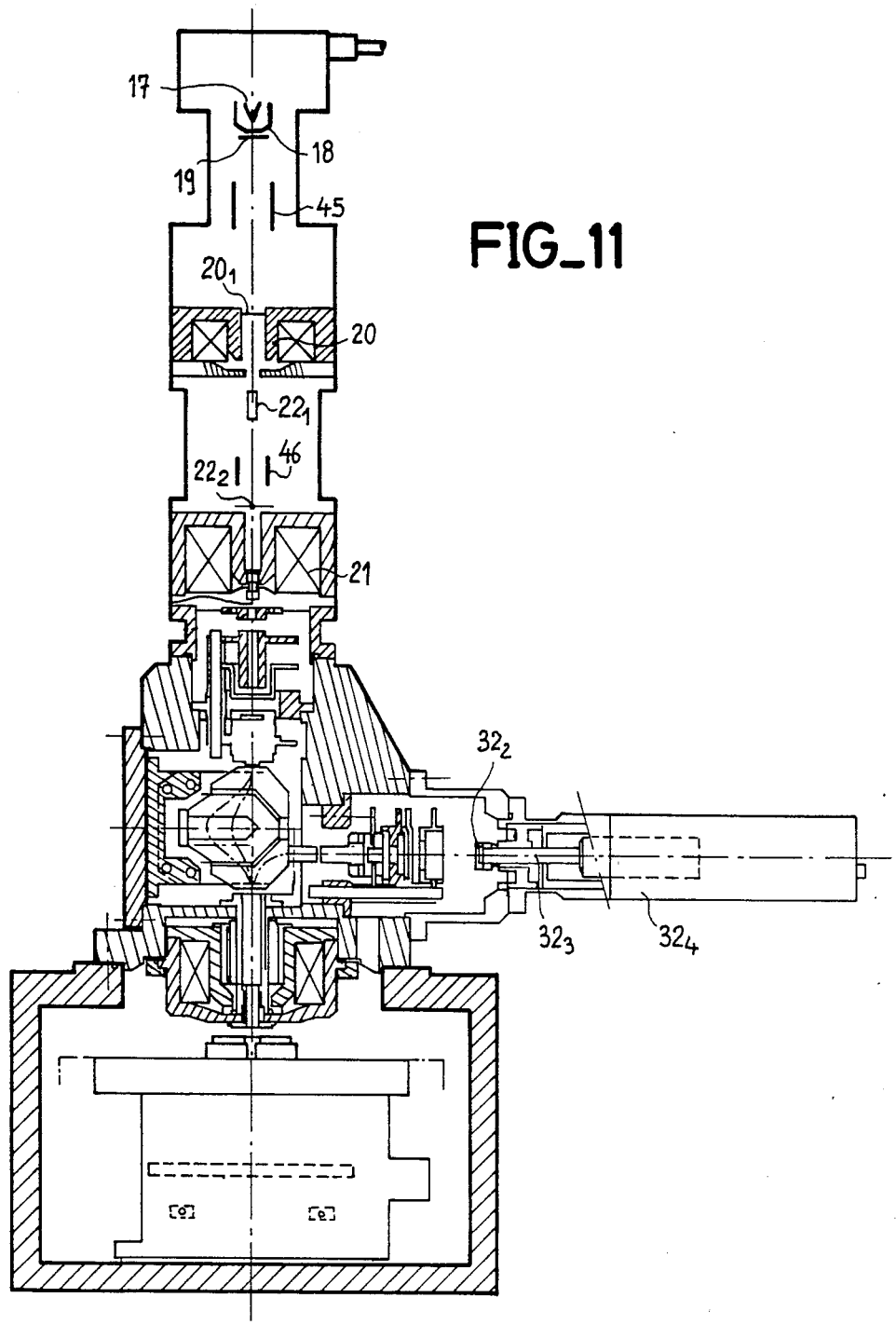
FIG_11

FIG_12-A
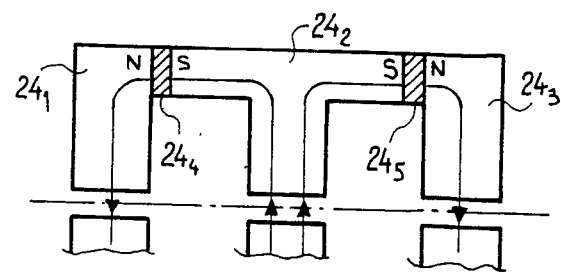
FIG_12-B
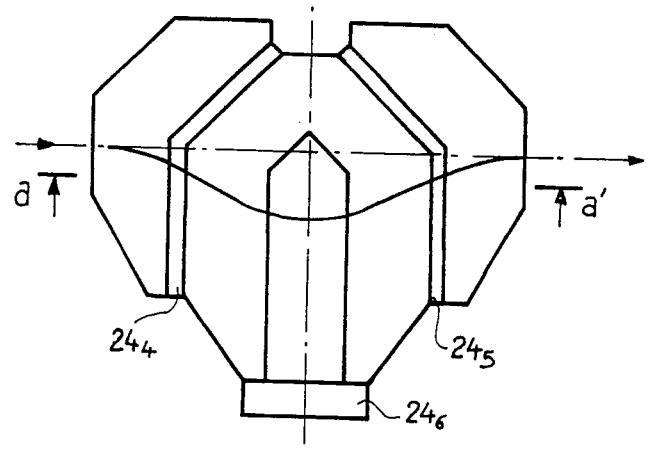

ELECTRON BEAM INTEGRATED CIRCUIT TESTER

BACKGROUND OF THE INVENTION

The present invention relates to an electron beam integrated circuit tester. More particularly, the present invention relates to an electron beam integrated circuit tester in which the position of a secondary beam at the input of a spectrometer is independent of the primary scanning so that defocusing of the spectrometer is avoided.

For testing integrated circuits, the use of test apparatus derived from electronic scanning microscopes is known. Generally, in these apparatuses, a primary electron beam is finely focused on each point of the integrated circuit to be tested and the electric potential thereof is determined by measuring in a region at a certain potential the energy of the secondary electrodes which are generated by bombardment of the primary beam. Examples of testers operating on this principle are described in the articles entitled:

Electron Beam Testing of VLSI circuits" by Eckard Wolgang et al and published in the *IEEE Journal of solid state circuits*, vol. sc 14, no. 2, April 1979, and "Fundamentals of electron beam testing of integrated circuits" by E Menzel and E. Kubalek and published in the review *Scanning*, vol. 5, 103.122 (1983).

In these testers, the space between the circuit to be tested and the pole piece belonging to the last focusing lens and facing it is occupied by the secondary electron spectrometer.

The qualities of a spectrometer, luminosity and resolution power, are all greater for greater dimensions. But, on the other hand, the qualities of the lens are weaker (higher abberations) the greater its focal distance. So in the design of the testers of known type a compromise is sought between the dimensions of the spectrometer and the focal distance of the last lens. Furthermore, placing the spectrometer between the lens and integrated circuit becomes troublesome if it is desired to place also in this gap accessory devices such as power supply prods for testing integrated circuits on a wafer before cutting up of the wafer.

The present aim of the invention is to overcome the above drawbacks.

SUMMARY OF THE INVENTION

For this purpose, the invention provides an electron beam integrated circuit tester including a primary electron source, means for supporting the integrated circuit, and an electronic column fixed with respect to the means supporting the integrated circuit for focusing the primary electron beam on the points of the circuit to be tested, the tester further including means for accelerating the electrons of secondary electrodes which are emitted by the integrated circuit in a colinear direction opposite that of the primary electron beam, separation means for directing out of the column the beam of secondary electrons accelerated by the acceleration means, and an energy spectrometer coupled to the separation means and fixed to the outside of the column for analyzing with respect to their energy the electrons of the beam of secondary electrons emitted by the integrated circuit and then separated by the separation means.

The advantage of the invention is that it leaves the space free between the final pole piece of the last lens of the electronic column and the circuit to be tested, thereby reducing the focal distance of this last lens and consequently reducing its abberations. The removal of the spectrometer from this space enables more space to be readily available for the installation, for example, of power supply prods for testing integrated circuits on wafers before cutting up.

Since the secondary electron beam is directed out of the column by the separation means, there exists practically no environmental constraint for designing the spectrometer which is to be fixed outside the column. In particular, its dimensions may be considerably increased with respect to those of the spectrometers of testers of the known type, which represents a considerable advantage from the point of view of the quality of the results obtained, both from the luminosity point of view and from the spectral resolution point of view.

The invention also has the advantage that it allows the deviation of the secondary beam to be corrected correlatively to that of the primary beam so as to obtain a secondary beam in a fixed position with respect to the input of the spectrometer whatever the movements of the emission point on the integrated circuit may be, at least to a certain extent. This guarantees constant characteristics of sensitivity and precision over a relatively extensive surface of the integrated circuit which may extend, for example, as far as adjacent surfaces of a 500 micron square. Also, the passage from one test point to another is facilitated and may be obtained by simple deflections of the primary electron beam, which forms a method more accurate and more rapid than the mechanical method of moving the object which is associated with the above mentioned testers of the prior art if the spectrometer is to keep strictly the same characteristics from one measuring point to another.

BRIEF DESCRIPTION OF THE DRAWINGS

Other features and advantages of the invention will also appear from the following description, with reference to the accompanying drawings which show:

FIG. 1, one embodiment shown schematically on an electron beam integrated circuit tester of the prior art;

FIG. 2A, the energy spectrum of the secondary electrons obtained by means of the tester of FIG. 1;

FIG. 2B, the signal corresponding to the spectrum of FIG. 2A, supplied by a counter-field spectrometer;

FIGS. 3A, 3B and 3C are time graphs illustrating use of the tester of FIG. 1 in stroboscopic mode;

FIG. 4, one embodiment shown schematically of a tester of the present invention;

FIG. 5, an optical diagram of the upper part of the tester of FIG. 4;

FIG. 6, an optical diagram of the beam separator;

FIG. 7, an optical diagram of the secondary electron collection device;

FIG. 8, an optical diagram of the lower part of the tester of FIG. 4;

FIGS. 9A and 9B, the paths of primary and secondary electrons through the scanning system of the tester of the invention;

FIGS. 10 and 11, one embodiment of the integrated circuit tester of the invention;

FIGS. 12A and 12B, the magnets forming the separator shown schematically in FIG. 6.

DETAILED DESCRIPTION

FIG. 1 shows schematically the physical part of an integrated circuit tester of the prior art. In this construction, the integrated circuit 1 is placed in an enclosure not shown and is connected to an external power supply device, also not shown, whose ground is connected to that of the apparatus, taken as potential reference. An electronic column communicating with the enclosure is disposed perpendicularly to the surface of the integrated circuit. This column includes typically an electron gun formed of a cathode-wehnelt assembly 2 and an anode 3, electromagnetic lenses 4, 5 and 6, and an electrostatic deflector 7, associated with a diaphragm 8, the whole of these elements being centered with respect to an optical axis 9. The electron gun emits a primary electron beam which is focused by the electromagnetic lenses 4, 5 and 6 so as to form a spot of very reduced diameter on the point of the integrated circuit to be tested. Deflector 7, by bringing the beam out of the hole in diaphragm 8, allows on or off modulating of the beam to be effected.

Bombardment of the point to be tested by the electrons of the primary beam causes the appearance of an emission of secondary electrons 13 which are detected by a detector 14 formed by a scintillator coupled to a photomultiplier. Under these conditions, the energy spectrum of the secondary electrons which is measured and a representation of which is shown in FIG. 2A, corresponds to the secondary electron emission spectrum offset by an amount $-eV$, where V is the potential of the integrated circuit at the bombarded point.

The assembly of the accelerating and retarding grids 10 and 11 and detector 14 form a secondary electron spectrometer, the purpose of the accelerating grid 10 of the spectrometer being to promote the collection of the secondary electrons. The retarding grid is biased to a potential $-U$ with respect to ground and only lets pass the electrons whose energy is greater than eU. By varying U and by assuming that the potential V of the point to be tested is fixed, the detector 14 delivers a signal S, shown in FIG. 2B, which is the integral of the spectrum. Measurement of the potential V of the point to be tested may, in this way, be obtained by measuring the value of the potential U for which the signal S reaches a given fraction So of its maximum value.

The device shown in FIG. 1 also allows dynamic measurements of the signals to be made at different points in the tested circuit. However, these measurements can only be made in real time up to frequencies which in practice do not exceed a few megahertz. To go beyond, the known systems use a sampling or stroboscopic method which consists in triggering the primary electron beam for very short pulses of duration $\tau$, in synchronism with the signals studied and with a certain phase shift $\phi$ with respect thereto.

In the way shown in FIGS. 3A to 3C, integration of the signal corresponding to the secondary electrons over a certain number of periods gives the instantaneous value of the signal (3B and 3C), at phase $\phi$, with a time resolution on the order of $\tau$. By scanning the phase $\phi$, it is possible to enhance the signal, spread out in time.

The tester which has just been described has the disadvantages already mentioned due, for a large part, to the interpositioning of grids 10, 11 and of the electron detector 14 in the space between the integrated circuit 1 and the last lens 6 of the electronic column. The electron beam integrated circuit tester of the invention which overcomes these drawbacks is described hereafter with the help of the simplified diagram of FIG. 4.

The physical part of the tester shown in this Figure includes three main parts:

a device 16 for moving an integrated circuit 15,
an electronic column formed of elements 17 to 30, and
a secondary electron spectrometer 32 having a coupling lens 31.

The integrated circuit 15 is supplied with power by a device, not shown, whose ground is connected to that of the apparatus.

The electronic column includes:
an electronic gun formed by a cathode 17, a wehnelt 18 and an anode 19,
two electromagnetic lenses or condensers 20 and 21,
a beam sampling device 22 situated between lenses 20 and 21,
an electrostatic lens 23 comprising four electrodes $23_1$ to $23_4$,
a magnetic separator 24 associated with a double input quadrupole 25 and an output quadrupole 26,
a final magnetic lens 27,
a scanning device placed in the channel of lens 27 and formed by an electrostatic deflector 28 and an electromagnetic deflector 29 which are coaxial, and
an anode 30 for accelerating the secondary electrons.

The spectrometer 32 fixed to the side of the column is coupled thereto by an electrostatic lens 31 whose role is, in particular, to cause the electrons, at the input of the spectrometer, to have a suitable energy. For example, with a grid spectrometer (also called "counterfield" spectrometer) the electrons are brought up to an energy close to that of emission. With a dispersion spectrometer, they will have an energy on the order of 1 keV.

The potentials of the different parts of the column are fixed in the following way:
the cathode 17 of the electron gun is at a potential $-e$ corresponding to the energy eE (except for the potential of integrated circuit 15) with which the electrons are to strike the integrated circuit, this energy in practice being between 0.5 keV and 10 keV,
the anode 19 of the gun is grounded and the tube inside lenses 20 and 21 connecting the anode 19 to electrode 23 is also grounded for reasons of convenience,
the annular electrode 30 for accelerating the secondary electrons is biased so as to create at the surface of the integrated circuit a field on the order of 1 kV/mm and so as to collect these electrons with good efficiency; in practice, it is, for example, at 8 kV and at 7 mm from the sample.

Furthermore, so that the product of the radius of gyration of the secondary electrodes in the separator 24 multiplied by the value of the induction is not too low, these electrons must have sufficient energy therein. It has been found convenient to give them an energy equal to their emission energy increased by eV by placing the separator 24 at the potential of anode 30. The separator may thus be contained in an equipotential enclosure whose anode 30 forms the bottom and whose electrode $23_4$ forms the upper part.

Finally, in so far as lens 23 is concerned, it follows from the foregoing that its endmost electrodes $23_1$ and $23_4$ are respectively at ground and at V. Its internal electrodes $23_2$ and $23_3$ are biased as a function of the energy of the primary electrons so as to give to the lens the focal distance calculated to cause an optical combination, which will be described further below.

The detailed optical diagram of the upper part of the electronic column is shown in FIG. 5. This part includes the electron gun, not shown, an aperture diaphragm $20_1$, the first condenser 20, a second condenser 21, and a beam sampling device formed by an electrostatic deflector $22_1$ and an occultation diaphragm $22_2$. In this part of the column, the "cross over" or pupil of the canon $(C0)_0$ is reduced successively to $(C0)_1$ then to $(C0)_2$.

The lens 20 is adjusted so as to form the image $(C0)_1$ at the level of the deflector $22_1$. Thus, the final image of the cross over on the integrated circuit disappears on the spot when the deflector $22_1$ is energized. Furthermore, the occultation diaphragm $22_2$ is placed in the conjugate plane, with respect to lens 0O, of the aperture diaphragm $20_1$; therefore, a minimum angular deflection is obtained for completely cutting off the beam.

The purpose of the magnetic separator 24 and the associated corrections 25 and 26 is:

to be achromatic and stigmatic for the primary beam, in the energy range of e(E+V), that is, for the values of 8.5 keV to 18 keV, and to deflect the secondary beam out of the column while keeping the stigmatism.

The magnetic separator 24, a theoretical diagram of which is shown in FIG. 6, comprises essentially three magnetic deflectors. It is equivalent for the primary beam to an assembly of three magnetic fields limited by planes perpendicular to the optical axis zz' defining 3 volumes of equal thicknesses a and also spaced apart by b in which reign homogeneous fields. Between P1 and P2, on the one hand, and P5 and P6 on the other, the induction vector is normal to the plane of the Figure; it is oriented forwardly and has an intensity b(z)=Bo. Between P3 and P4 the induction vector is also normal to the plane of the Figure but is oriented rearwardly and has an intensity B(z)=2 Bo. Considering the path of an electron in the plane of the Figure it is possible to show that, with the condition $\int B(z)dz=0$ fulfilled, the path is not deflected angularly by this triple deflector. In particular, an incident path following the axis zz' will leave the deflector along the same axis.

So as to obtain a sufficiently extensive field zone for suitably effecting the separation of the secondary beam, and for also obtaining a symmetry favorable to the practical construction of the magnets creating these fields, three magnetic field zones have on the secondary deviation side the contour shown in the right hand part of FIG. 6. Finally, in this Figure, it has been shown the path of axial rays of the primary beam $T_1$ (for the extreme values of E+V, that is to say 8.5 keV and 18 keV) and of the secondary beam $T_2$, with energy still equal to 10 keV, except for the emission energy. Physically, the sharp frontier magnetic fields which have just been considered cannot exist; the real magnetic fields are limited by leak fields which have an axial focusing action to the beams (that is to say perpendicularly to the deflection plane of the separator). The magnetic separator then introduces astigmatism in the primary beam. For correcting it, the double electrostatic quadrupole 25 having the deflection plane like the plane of symmetry is placed in front of the separator. It is possible to show that there in fact exists a setting of this double quadrupole for which a stigmatic image corresponds to a given object point. This property is used for providing an optical combination which is explained further below with reference to FIG. 8.

In so far as the secondary beam is concerned with energy close to 8 keV, the induction in the separator is adjusted so as to have a deflection of 90°. It is known that such a prism (90° deflection and input and output faces normal to the beam) has a chromatic focal point at point C, the intersection of the extensions of the object and image axes of the prism. Point C is the point from which seem to come rays coinciding with the input axis but corresponding to particles with slightly dispersed energies. Since it is also known in this configuration that if the object point is at C its radially focused image coincides with itself and that its axially focused image will be at C', between point C and the point at which the axial ray of the beam leaves the prism, it is advantageous to adjust the final lens 27 so that the secondary electron image of the bombarded point on this integrated circuit is formed at C. The quadrupole 26 which is placed at the output of the prism brings point C' to C which then forms a virtual achromatic and stigmatic image of the bombardment point on the integrated circuit. This will be particularly advantageous if the spectrometer 32 is a dispersion spectrometer and has an input diaphgram: the achromatic and stigmatic image will be projected on the latter by means of lens 31.

The diagram of the optical system for collecting the secondary electrons is shown in FIG. 7. As shown, the secondary electrons coming from point A are accelerated by the electric field created by the anode 30 brought to the potential V. This device forms an immersion optical system, and it is known that such an optical system gives of A a virtual image A' situated behind the surface of the integrated circuit, at a distance substantially equal to a third of the distance from the anode to the integrated circuit. It is this point A', which is imaged by means of the magnetic lens 27 at point C, is the achromatic object point of the magnetic prism for deflecting the secondary electrons. Lens 27 has then a fixed excitation, independent of the energy of the primary electrons.

It will be further noted that the other two magnetic lenses of the circuit, 20 and 21, have independent settings. Lens 20 is adjusted in practice close to its minimum focal distance so as to obtain the factor of maximum reduction of the upper part of the column. Lens 21 is adjusted as explained above for combining the cross over of the gun $(C0)_o$ with the mean plane of the deflector $22_1$. It is then the electrostatic lens 23 which is charged with providing, over the whole energy range of the primary electrons, the optical combination between the cross over $(C0)_o$ of the gun and the surface of the integrated circuit. For that, as shown in the diagram of FIG. 8, lens 23 is adjusted as to to give, of the "cross over" $(C0)_2$, an image centered on the stigmatic object point I of the magnetic separator which corresponds to the image point I', also coinciding with the conjugate of A' with respect to lens 27. The great flexibility required for this adaptation, from 0.5 keV to 10 keV of primary electron energy, is obtained by adjusting the biasing of the two internal electrodes.

For example:

for 1 keV, the electrode $23_2$ is at 4 kV and electrode $23_3$ at 8 keV, and the lens 23 operates in accelerator mode, for 10 keV, electrode $23_2$ is grounded and electrode $23_3$ is at −4.5 kV; lens 23 then functions under conditions close to those of the unipotential retarding lens.

The table below gives the main optical characteristics of the column for the two energies 1 keV and 10 keV of the primary beam.

| PRIMARY | 1 keV | 10 keV |
| --- | --- | --- |

| | | | |
|---|---|---|---|
| ENERGY ENLARGEMENT | lens 23 | 9 | 1.2 |
| | double quadrupole + separator | 2.3 | 2.3 |
| | lens 27 | 0.04 | 0.5 |
| REDUCTION FACTOR OF THE ASSEMBLY 20,21 | | 120 | 200 |
| DIAMETER OF THE SPOT ON THE INTEGRATED CIRCUIT (*) | | 0.3 um | 0.3 μm |

(*) assuming a "cross over" diameter of the gun of 40 μm.

Secondary electrons emitted normally to the surface of the integrated circuit and accelerated by anodes 30 have their path which is brought back along the optical axis z in the way shown in FIGS. 9A and 9B. These Figures show respectively paths, very much enlarged in the direction of the x-axis, projected in a plane containing the axis Z and in a plane orthogonal thereto relative to the deflection devices 28 and 29 and to the magnetic circuit $27_1$ of lens 27.

The electrostatic deflector 28 is formed of two pairs of plates, $28_1$ and $28_3$ biased at $+V$ and $-V$ and $28_2$ and $28_4$, biased at $+V'$ and $-V'$. These two pairs of plates deflect respectively the electrons along the axes x and y. The electromagnetic deflector 29 is formed of two pairs of coils $29_1$ and $29_3$, and $29_2$ and $29_4$, through which flow respectively the currents I, and I' and which deflect the electrons respectively along the axes x and y. By acting on the values of the current I and I' and of the voltages V and V', this configuration allows the primary electron beam to be directed with accuracy on any point of the integrated circuit at least not too far removed from the axis, and allows the secondary electron beam to be brought back along the optical axis Z. These results are obtained in application of the principles according to which the practice with charge q and speed $\vec{V}$ is subjected to a force $q\vec{E}$ in an electrostatic field E and to a force $q(\vec{V} \wedge \vec{B})$ in a magnetic field $\vec{B}$ and from the principle following from the two preceding ones according to which two electrons of opposite speeds undergo the same force in an electrostatic field and opposite forces in a magnetic field.

Referring to the representations shown in FIGS. 9A and 9B, a primary electron of energy, for example, 1 keV arriving along the optical axis Z is deflected by the scanning system along the path indicated by p so as to reach a point N of the integrated circuit which, in the particular case of FIG. 9B, is situated on the x axis, out of the optical axis Z. Naturally, to each impact point N on the integrated circuit there corresponds particular current I and I' or voltage V and V', values which must also be determined as a function of the rotation of the beam in lens 27 for reaching each point of impact. In the absence of deflection, a secondary electron, with energy for example of 5 eV, emitted at point N orthogonally to the integrated circuit, would be directed after passing through the field of the lens to point M of the optical axis shown in FIG. 9A.

In this embodiment of FIG. 9A, the deflector is centered on point M and, to make the path of the secondary electrons very close to the optical axis Z after passing through the scanning system, the coils and the deflection plates are energized respectively by currents $I_1$, $I'_1$ and voltages $V_1$ and $V'_1$ so as to obtain two magnetic and electric field vectors respectively, $\vec{B}_1$ and $\vec{E}_1$ in FIG. 9B, in quadrature. The fields $\vec{B}_1$ and $\vec{E}_1$ impose two forces of the same direction on an electron situated on axis Z and whose speed is colinear to the axis. If this electron is directed towards the increasing Z-axis, as is the case for example of a primary electron, the two forces are of the same direction. If it is directed, on the other hand, towards the decreasing Z-axis as is the case of a secondary electron, the two forces are of opposite directions. It is then sufficient to choose values of $I_1$, $I'_1$, $V_1$ and $V'_1$ such that the fields $\vec{E}_1$ and $\vec{B}_1$ deflect very few secondary electrons while on the contrary deflecting massively the primary electrons and to superimpose respectively on these currents at these voltages currents $I_2$ and $I'_2$ and voltages $V_2$ and $V'_2$ so as to obtain fields $\vec{E}_2$ and $\vec{B}_2$ shown in FIG. 9B in quadrature with respect to each other, confirming the relationship $(\vec{B_2}, \vec{E_2}) = -\pi/2$ such that the primary electrons are very slightly deflected and that on the contrary the secondary electrons are heavily deflected by the couple $(\vec{B_2}, \vec{E_2})$. Under these conditions, with a suitable choice of the deflection currents and voltages, the path of the secondary electrons can be brought close to the optical axis Z. With this method, the position of the secondary beam at the input of the spectrometer is made independent of the primary scanning and thus "defocusing" of the spectrometer is avoided, which phenomenon would be particularly troublesome if this latter is of the dispersion type.

A detailed embodiment of the tester of the invention is described hereinafter with reference to FIGS. 10, 11 and 12. In FIG. 10, the integrated circuit to be tested is fixed to a plate 33 connected to an external signal generator (not shown) by electric connections 34. Plate 33 is itself supported by a mechanical device 16 for moving the integrated circuit in its plane by means of external controls, not shown, so as to place the point or region to be tested under the electron beam. The mechanical device 16 is placed inside a sealed enclosure 35 over which is mounted the electronic column. This latter is formed of frame 36 on and inside which are fixed the elements 17 to 30 of the tester previously described with reference to the simplified diagram of FIG. 4. Frame 36 also contains the coupling lens of the spectrometer 32 which it supports.

In FIG. 10, the upper elements of the column 17, 18, 20 and 22 are not shown; neither is the detector of the spectrometer. The elements shown, relative to the primary optical system, include from the top, the second electromagnetic lens 20, the electrostatic lens 23, the double quadrupole 25, the magnetic separator 24 and the last electromagnetic lens 27.

The second electromagnetic lens 20 has a conventional shape and is formed of the magnetic circuit $20_1$, its energization coil $20_2$ and the amagnetic spacer $20_3$, the magnetic circuit $20_1$ being grounded and the tubular part of the anode 19 of FIG. 4 being, in FIG. 10, formed by the channel of the magnetic circuit $20_1$ itself.

The electrostatic lens 23 is formed by four annular electrodes $23_1$ to $23_4$, the electrode $23_1$ being fixed to the magnetic circuit $20_1$ and therefore being at ground potential. The electrodes $23_2$ and $23_3$ are connected independently to two external variable voltages sources, and the final electrode $23_4$ is connected to the acceleration potential of the secondary electrons V.

The double quadrupole 25 for correcting the astigmatism of the magnetic separator for the primary beam is formed of the two quadrupoles $25_1$ and $25_2$. Each of them is formed by two pairs of plates, each disposed so that the plane of symmetry parallel to the plates is respectively in the plane of the Figure and perpendicular thereto. These plates are brought to potentials on the order of a few hundred volts with respect to their mean potential, which is equal to V. The electrodes of lens 23 and the quadrupoles $25_1$ and $25_2$ are supported by four isolating posts only one of which, post 37, is shown. These posts are themselves fixed to the frame 36 through the ring 38.

The magnetic separator 24 has a structure which will be explained further below with reference to FIGS. 12A and 12B.

The last electromagnetic lens 27 is formed of the magnetic circuit $27_1$, the energization coil $27_2$ and the amagnetic spacer $27_3$. The design of this lens is similar to that of the last lens of a conventional electronic scan microscope. In the channel of this lens are disposed, coaxially, and from the outside to the inside:
the electromagnetic deflector 29,
a sealed tube $39_1$,
a conducting tube $39_2$ brought to the potential V, and the lower enlarged part of which forms the anode 30, and
the electrostatic deflector 28.

Still with reference to FIG. 10 we find, situated laterally with respect to the electron column, the elements relative to the optical system of the secondary electrodes formed by the quadrupole 26, the electrostatic lens 31 and the diaphragm 40. The astigmatism correction quadrupole is formed by two pairs of plates, each disposed so that the plane of symmetry parallel to the plates is respectively in the plane of the Figure and perpendicular thereto. The electrostatic coupling lens 31 of the spectrometer is formed by the annular electrodes $31_1, 31_2$ and $31_3$. The opening in electrode $31_3$ is covered by the grid $32_1$ of the spectrometer 32 which is of the counter field type. The diaphragm 40 limits the opening of the secondary beam and eliminates the electrons back scattered from the target or from the walls. Elements 26, $31_1, 31_2, 31_3$ and 40 are supported by a four post mounting similar to that of lens 23, and only a single post 41 of which is shown. These posts 41 are supported by the frame 35, through the ring 42.

Still referring to FIG. 10, it will be noted that the coils 22 and $27_2$ as well as the reflector 29 are at atmospheric pressure and that the sealed enclosure inside which a vacuum is formed includes, for the low part of the apparatus shown in FIG. 10, the chamber 36, the magnetic circuit $27_1$, the spacer $27_3$, the tube 38, frame 35, the magnetic circuit $20_1$, the spacer $20_3$, the intermediate tube 43 and the body 44 of the spectrometer. Sealing between these elements is provided by seals, generally not shown.

Finally, it will be noted that in the embodiment shown in FIG. 10, the side walls of the equipotential box 30 do not exist, but the optical elements which they contain are each brought to the potential V and sufficiently close to each other so that the primary beam, between electrode $23_4$ and anode 30, remains in an equipotential space at the potential V.

FIG. 11 shows completely the embodiment of the invention of which FIG. 10 shows the lower part.

With respect to FIG. 11, there are shown in addition the known elements of the technique forming the upper part of the column and the spectrometer, which are:
for the column:
the electron gun formed of the cathode 17, the wehnelt 18, and the anode 19,
the aperture diaphragm $20_1$,
the first electromagnetic lens 20,
the deflector $22_1$ and the diaphragm $22_2$ forming the on or off modulator 22 of the beam, and
the magnetic alignment devices 45 and 46,
and for the spectrometer:
the scintillator $32_2$,
the light guide $32_3$, and
the photomultiplier $32_4$.

FIGS. 12A and 12B show the magnetic separator 24.

This separator is formed of two halves symmetrical with respect to the deflection plane (plane of FIGS. 10 and 11). FIG. 12B shows in a top view one of the halves in a direction perpendicular to the plane of symmetry. This half is formed of three soft iron pole pieces $24_1$, $24_2$, $24_3$ and two permanent magnets $24_4$ and $24_5$ (FIG. 12A) whose poles are disposed as shown so as to create fields of opposite directions in the central air gap and in the endmost air gap. The magnetic shunt $24_6$, on the other hand, serves for adjusting the achromatism of the separator. The value of the induction in the endmost air gaps is on the order of $10^{-2}$ Tesla, this value being half that reigning in the central air gap.

FIG. 12A shows a sectional view through aa' of the half deflector shown in FIG. 12B.

What is claimed is:

1. An electron beam intergrated circuit tester, comprising:
   means for generating a primary electron beam;
   means for supporting an integrated circuit to be tested;
   an electronic column disposed relatively above said supporting means of said integrated circuit for directing said primary electron beam along an optical axis inside the electronic column perpendicularly toward the surface of said integrated circuit, including:
   means for accelerating secondary electrons which are emitted away from said integrated circuit along said axis in response to said primary electron beam so as to form a secondary electron beam, said means for accelerating secondary electrons being disposed directly opposite the integrated circuit and including an electromagnetic lens centered with respect to the optical axis of the electronic column for focusing the primary electrons of the primary electron beam onto the integrated circuit and an acceleration electrode supported by one end of a hollow tube centered with respect to the optical axis of the electromagnetic lens for letting pass the primary and secondary electrons in directions extending along the axis of the tube,
   beam scanning means for positioning said primary electron beam onto predetermined points of said integrated circuit and for directing said secondary electron beam, after being accelerated by said accelerating means, along said axis of said tube, and
   separation means disposed relatively above said electromagnetic lens for focusing the primary electrons and for directing out of said electronic column said secondary electron beam which has been directed by said beam scanning means, said separation means including three pole pieces for separating their primary electron beam from the secondary electron beam and for directing the secondary electron beam out of said electronic column; and
   an energy spectrometer having an input coupled to an output of said separation means for analyzing, depending on the energy, the secondary electrons of said secondary electron beam directed out of said electronic column by said pole pieces.

2. The integrated circuit tester as claimed in claim 1, wherein said electromagnetic lens for focusing the primary electrons is formed by a magnetic circuit surrounding the tube supporting the electrode and includes an annular amagnetic spacer close to the electrode for focusing the primary electron beam onto said predetermined points of the integrated circuit to be tested.

3. The integrated circuit tester as claimed in claim 1, wherein the beam scanning means includes deflection electrodes fixed to an internal wall of the tube supporting said acceleration electrode and deflection coils disposed around the tube supporting the acceleration electrode.

4. The integrated circuit tester as claimed in claim 3, wherein the energy spectrometer is coupled to the separation means through an electrostatic lens and a quadrupole.

5. The integrated circuit tester as claimed in claim 1, wherein the beam scanning means is disposed inside the electromagnetic lens.

6. An electron beam integrated circuit tester, comprising:
   means for generating a primary electron beam;
   electronic column means disposed relatively above said supporting means of said integrated circuit for directing said primary electron beam along an optical axis inside the electronic column means perpendicularly toward the surface of said integrated circuit, including:
   means for accelerating secondary electrons which are emitted away from said integrated circuit along said axis in response to said primary electron beam so as to form a secondary electron beam, said means for accelerating secondary electrons being disposed directly opposite the integrated circuit and including an electromagnetic lens centered with respect to the optical axis of the electronic column means for focusing the primary electrons of the primary electron beam onto the integrated circuit and an acceleration electrode supported by one end of a hollow tube centered with respect to the optical axis of the electromagnetic lens for letting pass the primary and secondary electrons in directions extending along the axis of the tube,
   beam scanning means for positioning said primary electron beam onto predetermined points of said integrated circuit and for directing said secondary electron beam, after being accelerated by said accelerating means, along said axis of said tube, and
   separation means disposed relatively above said electromagnetic lens for directing out of said electronic column said secondary electron beam which has been directed by said beam scanning means, said separation means comprising first, second and third magnetic deflectors superimposed above the electromagnetic lens for providing three magnetic fields perpendicular to the direction of the optical axis of said electromagnetic lens, said magnetic fields being alternately oriented in opposite directions, each magnetic field having a predetermined value for permitting the primary electron beam travelling along said optical axis of the electronic column means and entering the separation means successively through said first, second and third magnetic deflectors to leave the separation means along said optical axis toward said electromagnetic lens, and directing the secondary electron beam out of said electronic column means via said third magnetic deflector in a direction along an exit axis perpendicular to said optical axis, said exit axis crossing said optical axis at a crossing point c, which is a focal point of each point tested on the integrated circuit; and
   an energy spectrometer having an input coupled to said third magnetic deflector of said separation means for analyzing, depending on their energy, the secondary electrons of said secondary electron beam directed out of said electronic column means by said separation means.

* * * * *